(12) United States Patent
Fang et al.

(10) Patent No.: US 8,999,794 B2
(45) Date of Patent: Apr. 7, 2015

(54) SELF-ALIGNED SOURCE AND DRAIN STRUCTURES AND METHOD OF MANUFACTURING SAME

(75) Inventors: Ziwei Fang, Hsinchu (TW); Ying Zhang, Hsinchu (TW); Jeff J. Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 500 days.

(21) Appl. No.: 13/183,043

(22) Filed: Jul. 14, 2011

(65) Prior Publication Data

US 2013/0017660 A1    Jan. 17, 2013

(51) Int. Cl.
| H01L 21/336 | (2006.01) |
| H01L 21/306 | (2006.01) |
| H01L 21/8238 | (2006.01) |
| H01L 21/265 | (2006.01) |
| H01L 29/66 | (2006.01) |
| H01L 29/78 | (2006.01) |
| H01L 21/8234 | (2006.01) |
| H01L 21/3065 | (2006.01) |

(52) U.S. Cl.
CPC .. *H01L 21/30617* (2013.01); *H01L 21/823814* (2013.01); *H01L 21/26513* (2013.01); *H01L 29/66636* (2013.01); *H01L 29/7848* (2013.01); *H01L 21/823412* (2013.01); *H01L 21/823418* (2013.01); *H01L 21/823807* (2013.01); *H01L 21/3065* (2013.01); *H01L 29/66545* (2013.01); *H01L 29/66628* (2013.01)

(58) Field of Classification Search
USPC ................................. 438/285, 299, 585, 478
See application file for complete search history.

(56) References Cited

U.S. PATENT DOCUMENTS

| 5,413,945 | A | 5/1995 | Chien et al. | |
| 5,650,340 | A | 7/1997 | Burr et al. | |
| 6,133,082 | A | 10/2000 | Masuoka | |
| 6,579,770 | B2 | 6/2003 | Rodder et al. | |
| 6,585,841 | B1 | 7/2003 | Popp et al. | |
| 7,045,407 | B2 * | 5/2006 | Keating et al. | 438/198 |
| 7,078,285 | B1 * | 7/2006 | Suenaga | 438/199 |
| 7,148,097 | B2 | 12/2006 | Yu et al. | |
| 7,170,130 | B2 * | 1/2007 | Fang et al. | 257/316 |
| 7,195,985 | B2 * | 3/2007 | Murthy et al. | 438/341 |
| 7,303,999 | B1 * | 12/2007 | Sriraman et al. | 438/719 |
| 7,494,858 | B2 * | 2/2009 | Bohr et al. | 438/198 |

(Continued)

FOREIGN PATENT DOCUMENTS

| JP | 2003-033201 | 2/1991 |
| JP | 2006-141642 | 6/2006 |

OTHER PUBLICATIONS

U.S. Appl. No. 12/981,610, filed Dec. 30, 2010, entitled "Method of Manufacturing Source/Drain Structures," 29 pages, Unpublished.

(Continued)

*Primary Examiner* — Savitr Mulpuri
(74) *Attorney, Agent, or Firm* — Haynes and Boone, LLP

(57) ABSTRACT

An integrated circuit device and method for manufacturing the integrated circuit device are disclosed. In an example, the method includes forming a gate structure over a substrate; forming a doped region in the substrate; performing a first etching process to remove the doped region and form a trench in the substrate; and performing a second etching process that modifies the trench by removing portions of the substrate.

22 Claims, 7 Drawing Sheets

(56) References Cited

U.S. PATENT DOCUMENTS

| | | | |
|---|---|---|---|
| 7,667,227 B2* | 2/2010 | Shimamune et al. | 257/19 |
| 2005/0164450 A1* | 7/2005 | Fang et al. | 438/257 |
| 2006/0185135 A1 | 8/2006 | Yamamoto et al. | |
| 2008/0283906 A1* | 11/2008 | Bohr | 257/327 |
| 2009/0101942 A1* | 4/2009 | Dyer | 257/288 |
| 2010/0167486 A1* | 7/2010 | Shin | 438/300 |
| 2010/0311218 A1 | 12/2010 | Fukutome et al. | |
| 2011/0183481 A1* | 7/2011 | Dyer | 438/198 |
| 2012/0058616 A1* | 3/2012 | Ahn et al. | 438/285 |

OTHER PUBLICATIONS

U.S. Appl. No. 12/816,519, filed Jun. 16, 2010, entitled "Integrated Circuit Device with Well Controlled Surface Proximity and Method of Manufacturing Same," 58 pages, Unpublished.

U.S. Appl. No. 12/827,344, filed Jun. 30, 2010, entitled "Integrated Circuit Device with Well Controlled Surface Proximity and Method of Manufacturing Same," 34 pages, Unpublished.

U.S. Appl. No. 12/913,041, filed Oct. 27, 2010, entitled "Method of Manufacturing Source/Drain Structure," 34 pages, Unpublished.

Daniel L. Flamm "Mechanisms of Silicon Etching in Fluorine-and Chlorine-Containing Plasmas", Pure & Appl. Chem., vol. 62, No. 9, pp. 1709-1720, 1990.

Y.X. Li et al., "Fabrication of a Single Crystalline Silicon Capacitive Lateral Accelerometer Using Micromaching Based on Single Step Plasma Etching", 0-7803-2503-6, 1995, IEEE, pp. 398-403.

Gregory T. A. Kovacs et al., "Bulk Micromachining of Silicon", Proceedings of the IEEE, vol. 86, No. 8, Aug. 1998, pp. 1536-1551.

* cited by examiner

SELF-ALIGNED SOURCE AND DRAIN STRUCTURES AND METHOD OF MANUFACTURING SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as a metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often implements epitaxially grown silicon (Si) to form raised source and drain features for an n-type device, and epitaxially growing silicon germanium (SiGe) to form raised source and drain features for a p-type device. Various techniques directed at shapes, configurations, and materials of these source and drain features have been implemented to further improve transistor device performance. Although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
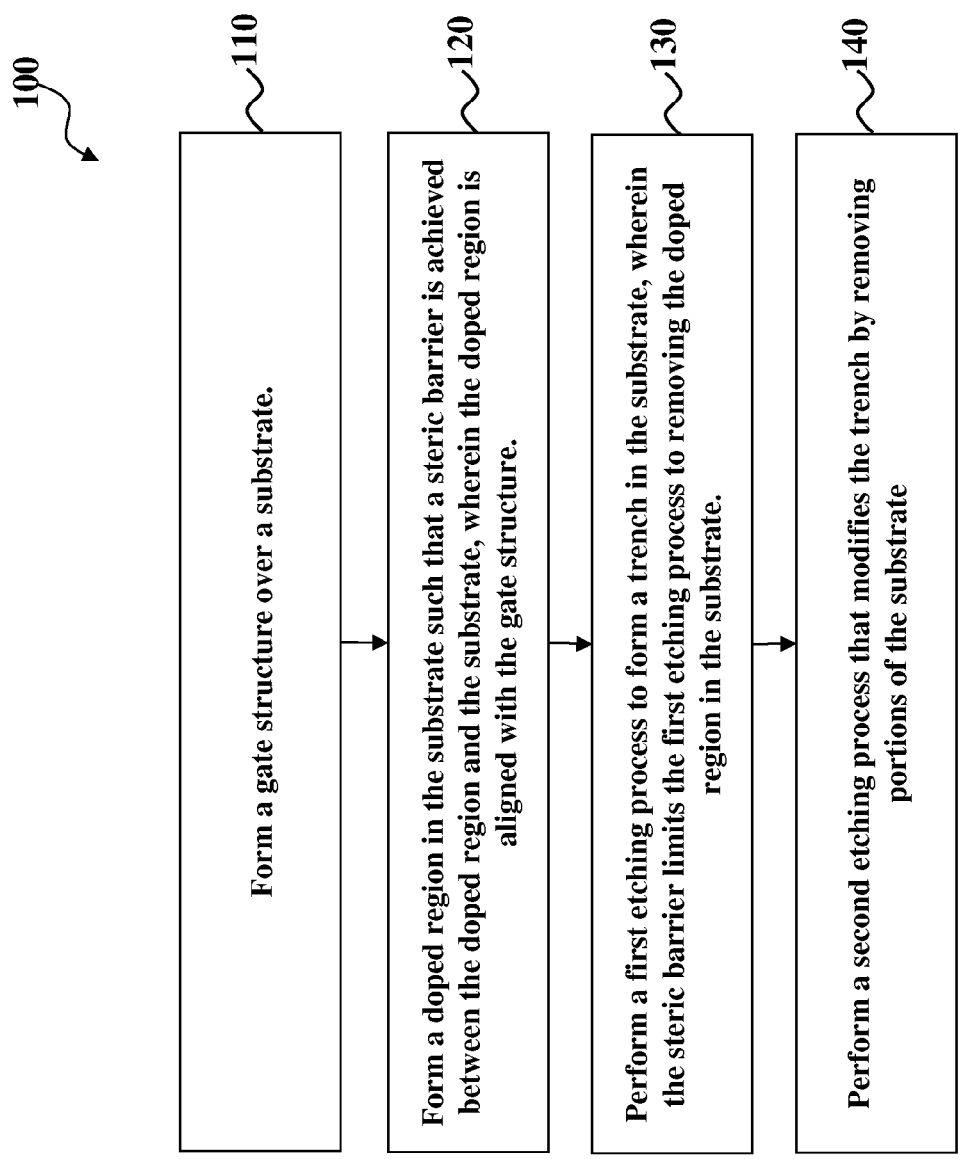
FIG. 1 is a flow chart of a method for fabricating an integrated circuit device according to an embodiment of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of an embodiment of a method 100 for fabricating an integrated circuit device according to various aspects of the present disclosure. The method 100 begins at block 110 where a gate structure is formed over a substrate. At block 120, a doped region in the substrate such that a steric barrier is achieved between the doped region and the substrate, wherein the doped region aligned with the gate structure. At block 130, a first etching process is performed to form a trench in the substrate, wherein the steric barrier limits the first etching process to removing the doped region in the substrate. The method continues with block 140 where a second etching process is performed that modifies the trench by removing portions of the substrate. The method 100 may continue to complete fabrication of the integrated circuit device. Additional steps can be provided before, during, and after the method 100, and some of the steps described can be replaced or eliminated for additional embodiments of the method. The discussion that follows illustrates various embodiments of an integrated circuit device that can be fabricated according to the method 100 of FIG. 1.

FIGS. 2-7 are various diagrammatic cross-sectional views of an embodiment of an integrated circuit device 200 during various fabrication stages according to the method 100 of FIG. 1. FIGS. 2-7 have been simplified for the sake of clarity to better understand the inventive concepts of the present disclosure. In the depicted embodiment, as will be further discussed below, the integrated circuit device 200 includes field effect transistor devices, such as n-channel field effect transistors (NFETs) and p-channel field effect transistors (PFETs). The integrated circuit device 200 can further include memory cells and/or logic circuits; passive components such as resistors, capacitors, inductors, and/or fuses; and active components, such as metal-oxide-semiconductor field effect transistors (MOSFETs), complementary metal-oxide-semiconductor transistors (CMOSs), high voltage transistors, and/or high frequency transistors; other suitable components; or combinations thereof. Additional features can be added in the integrated circuit device 200, and some of the features described below can be replaced or eliminated for additional embodiments of the integrated circuit device 200.

Figure 2:
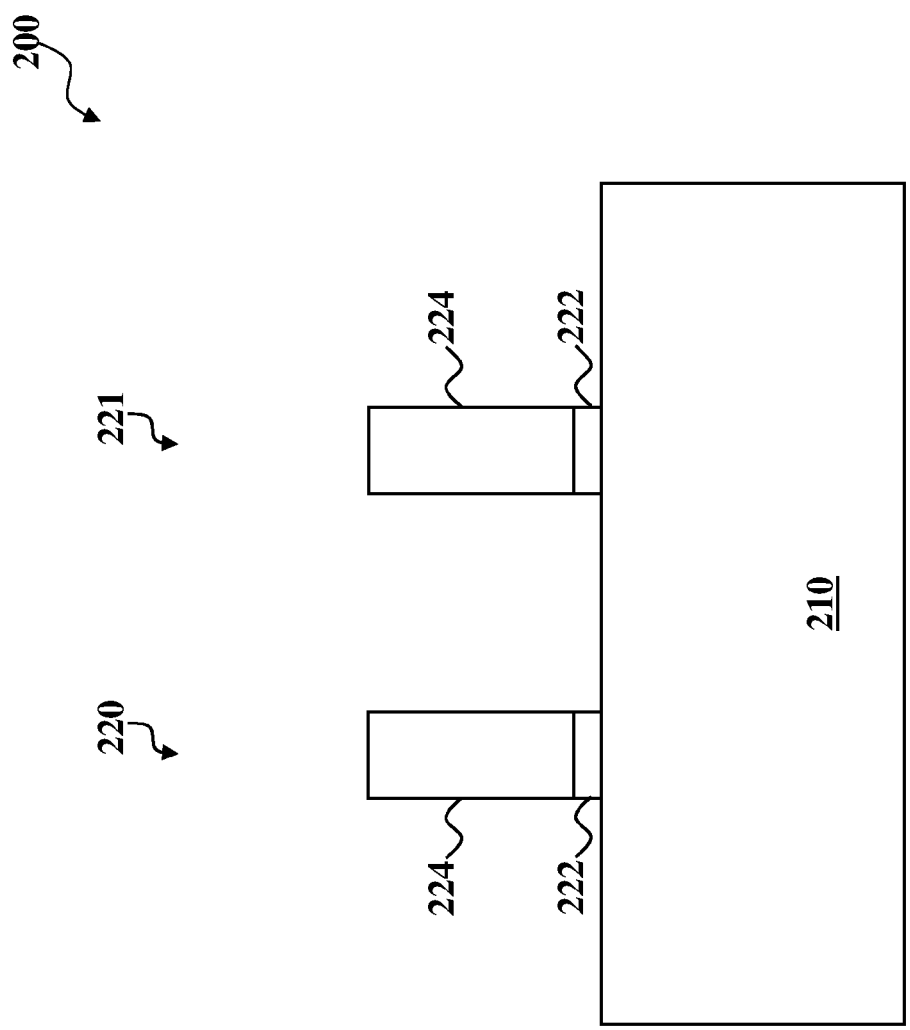
FIGS. 2-7 are various diagrammatic cross-sectional views of an embodiment of an integrated circuit device during various fabrication stages according to the method of FIG. 1.

In FIG. 2, a substrate 210 is provided. In the depicted embodiment, the substrate 210 is a semiconductor substrate including silicon. Further, in the depicted embodiment, the substrate 210 is an undoped or lightly p-type doped substrate. The substrate may be a lightly n-type doped substrate. Alternatively or additionally, the substrate 210 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer.

The substrate 210 may include various doped regions depending on design requirements of the integrated circuit device 200 (such as p-type wells or n-type wells). The doped regions are formed by an ion implantation process, diffusion process, other suitable process, or combinations thereof. The doped regions may be doped with p-type dopants, such as boron or $BF_2$; n-type dopants, such as phosphorus or arsenic; or a combination thereof. The doped regions may be formed directly on the substrate 210, in a P-well structure, in a N-well structure, in a dual-well structure, or using a raised structure. The integrated circuit device 200 may include an NFET device and/or a PFET device, and thus, the substrate 210 may include various doped regions configured for the NFET device and/or PFET device.

Isolation features may be formed in the substrate 210 to isolate various regions and/or devices of the substrate 210. The isolation features utilize isolation technology, such as local oxidation of silicon (LOCOS) and/or shallow trench isolation (STI), to define and electrically isolate the various regions. The isolation features include silicon oxide, silicon nitride, silicon oxynitride, other suitable materials, or combinations thereof. The isolation features are formed by any suitable process. As one example, forming an STI includes using a lithography process to expose a portion of the substrate, etching a trench in the exposed portion of the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide.

A gate structure 220 and a gate structure 221 are disposed over the substrate 210. The gate structures 220 and 221 are formed by deposition, lithography patterning, etching processes, or combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable deposition methods, or combinations thereof. The lithography patterning processes include photoresist coating (such as spin-on coating), soft baking, mask aligning, exposure, post-exposure baking, developing the photoresist, rinsing, drying (e.g., hard baking), other suitable processes, or combinations thereof. Alternatively, the photolithography exposing process is implemented or replaced by other proper methods, such as maskless photolithography, electron-beam writing, or ion-beam writing. The etching processes include dry etching, wet etching, other etching methods, or combinations thereof.

In the depicted embodiment, the gate structures 220 and 221 include a gate dielectric layer 222 and a gate layer 224 (referred to as a gate electrode). The gate dielectric layer 222 and gate layer 224 form gate stacks of the gate structures 220 and 221. The gate stacks may include numerous other layers, for example, capping layers, interface layers, diffusion layers, barrier layers, hard mask layers, other suitable layers, or combinations thereof. The gate dielectric layer 222 is disposed over the substrate 210 and includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, other suitable materials, or combinations thereof. The gate dielectric layer 222 may include a multilayer structure. For example, the gate dielectric layer 222 may include an interfacial layer, and a high-k dielectric material layer formed on the interfacial layer. An exemplary interfacial layer may be a grown silicon oxide layer formed by a thermal process or ALD process.

The gate layer 224 is disposed over the gate dielectric layer 222. In the depicted embodiment, the gate layer 224 is a polycrystalline silicon (polysilicon) layer. The polysilicon layer may be doped for proper conductivity. Alternatively, the polysilicon is not doped, for example, if the polysilicon serves as a dummy gate that will be replaced in a subsequent gate replacement process. Alternatively, the gate layer 224 includes a conductive layer having a proper work function, therefore, the gate layer 224 can also be referred to as a work function layer. The work function layer includes any suitable material, such that the layer can be tuned to have a proper work function for enhanced performance of the associated device. For example, if a p-type work function metal (p-metal) for a PFET device is desired, TiN or TaN may be used. On the other hand, if an n-type work function metal (n-metal) for an NFET device is desired, Ta, TiAl, TiAlN, or TaCN, may be used. The work function layer may include doped conducting oxide materials. The gate layer 224 may include other conductive materials, such as aluminum, copper, tungsten, metal alloys, metal silicide, other suitable materials, or combinations thereof. For example, where the gate layer 224 includes a work function layer, another conductive layer can be formed over the work function layer.

Figure 3:
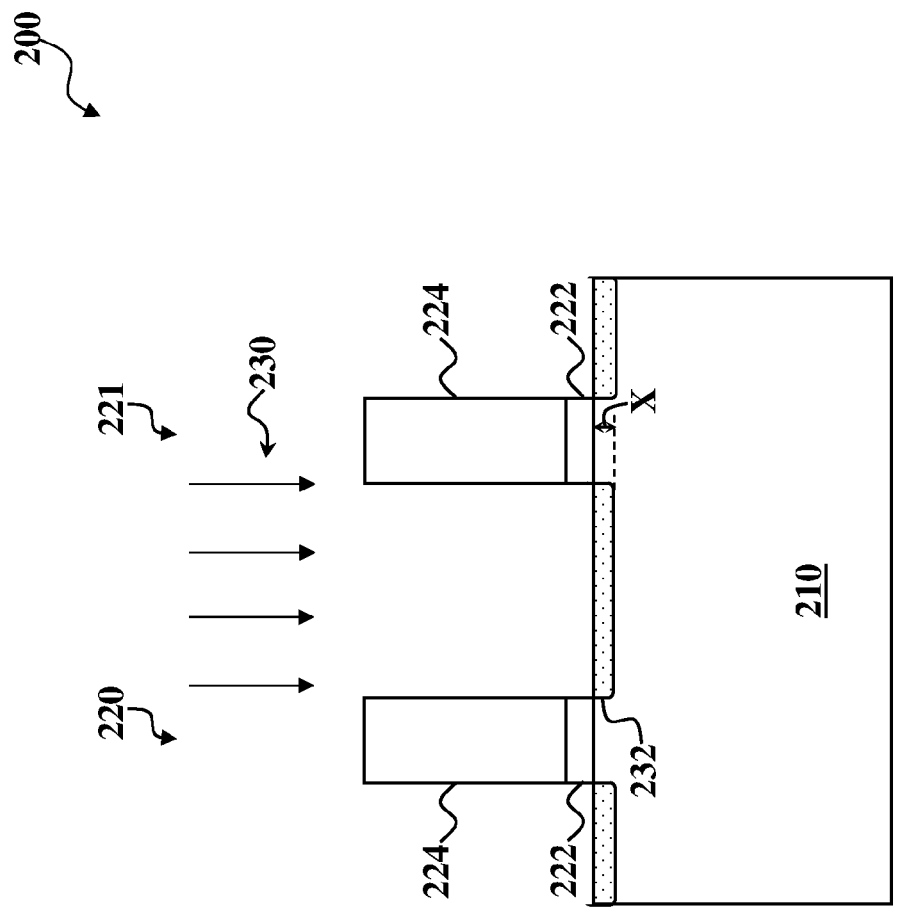

In FIG. 3, a process 230 forms doped regions 232 in source and drain regions of the substrate 210. The process 230 includes an ion implantation process, diffusion process, other suitable process, or combination thereof. Where the process 230 uses an ion implantation process, a doping or non-doping species may be implanted at an angle normal to a surface of the substrate 210 or at an angle tilted to a normal of a surface of the substrate 210 (in other words, a tilt angle ion implantation). The doped regions 232 are formed in the substrate 210, interposed by the gate structures 220 and 221. For example, the doped regions 232 are aligned with sidewalls of the gate stacks (gate dielectric layer 222 and gate layer 224) of the gate structures 220 and 221. The doped regions 232 extend from a surface of the substrate 210 to a depth, X, in the substrate 210. In an example, the doped regions 232 have a depth, X, of about 5 nm to about 50 nm. In the depicted embodiment, the doped regions 232 are doped with an n-type dopant, such as arsenic (As). Alternatively or additionally, the doped regions 232 are doped with another n-type dopant, such as phosphorous (P) or antimony (Sb). In yet another alternative, the doped regions 232 are doped with a p-type dopant, such as boron or $BF_2$. As described further below, a doping concentration of the doped regions 232 is sufficient to cause a steric barrier between the doped regions 232 and substrate 210. For example, the doped regions 232 are heavily doped n-type regions. In an example, the doping concentration is greater than or equal to about $5 \times 10^{19}$ atoms/cm$^3$. One skilled in the art will recognize that the terms lightly doped and heavily doped are terms of art that describe a doping concentration of the region that depends on the specific device type, technology generation, minimum feature size, and/or other factors. Accordingly, lightly doped and heavily doped should be interpreted in light of the technology being evaluated and not limited to the described embodiments herein. One or more annealing processes may be used to modify the doping concentration of the doped regions 232.

Figure 4:
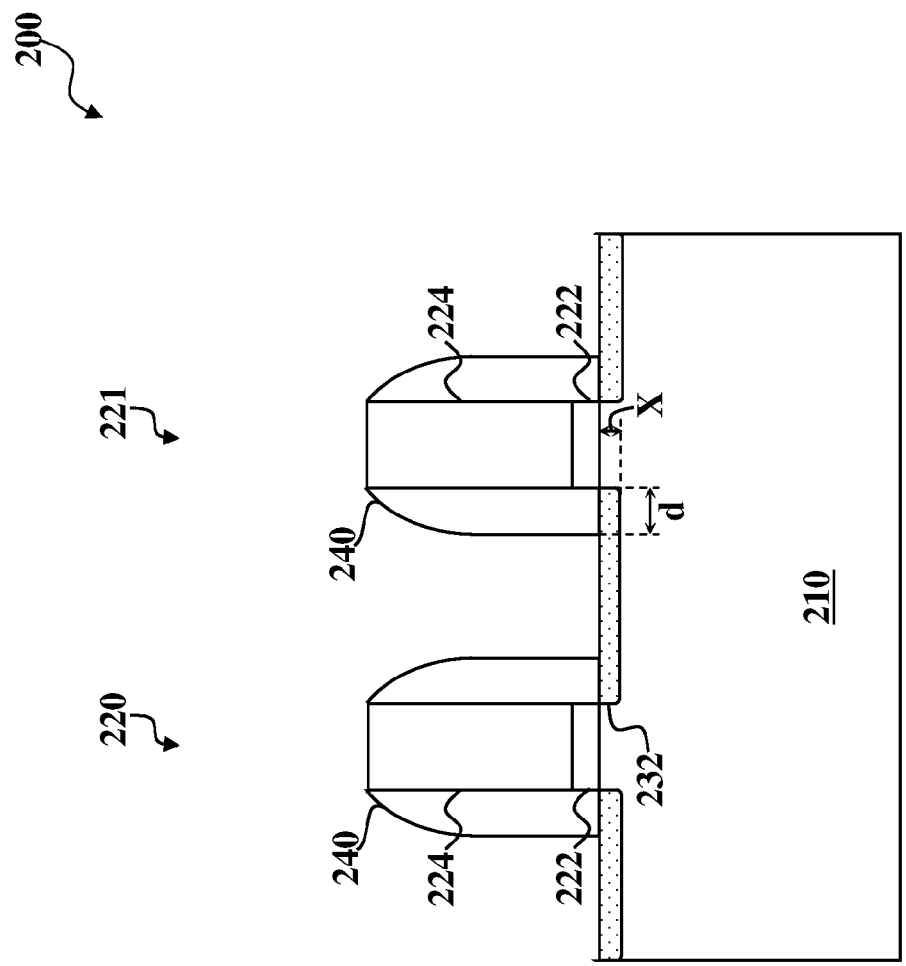

In FIG. 4, spacers are formed for gate structures 220 and 221. In the depicted embodiment, spacers 240 are formed by a suitable process. For example, a dielectric layer, such as a silicon nitride layer, is blanket deposited over the integrated circuit device 200; and then, the silicon nitride layer is anisotropically etched to remove the silicon nitride layer to form spacers 240 as illustrated in FIG. 4. The spacers 240 are positioned adjacent the sidewalls of the gate stacks (gate dielectric layer 222 and gate layer 224) of the gate structures 220 and 221. Alternatively or additionally, the spacers 240 include another dielectric material, such as silicon oxide, silicon carbon nitride, or combinations thereof. The spacers 240 have a thickness, d, which overlaps portions of the doped regions 232. In an example, the doped regions 232 have a thickness, d, of about 3 nm to about 30 nm.

Figure 5:
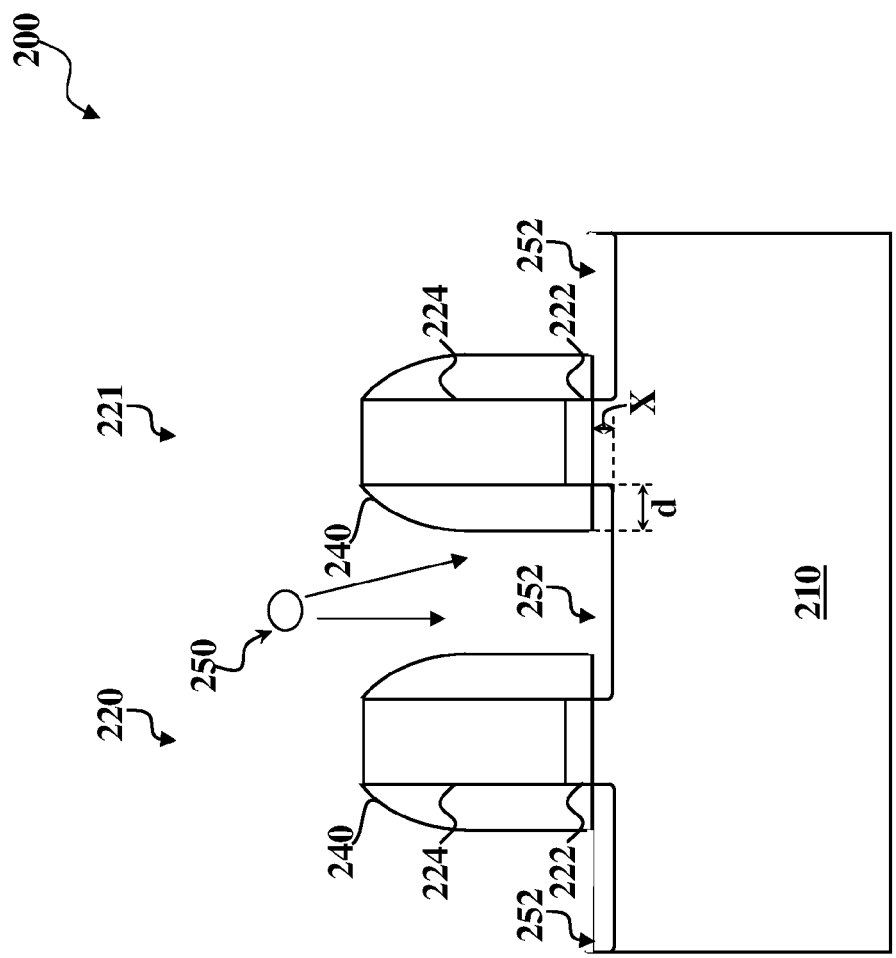

In FIG. 5, an etching process 250 removes portions of the substrate 210 to form trenches 252 in the substrate 210. In the depicted embodiment, the etching process 250 utilizes a dry etching process, specifically a plasma etching process. The dry etching process has etching parameters that can be tuned to achieve varying profiles for the trenches 252, such as etchants used, etching temperature, etching solution concentration, etching pressure, source power, RF bias voltage, RF bias power, etchant flow rate, and other suitable parameters. In the depicted embodiment, the etching process 250 is a zero-biased plasma etching process that uses a chlorine-based etching chemistry to form trenches 252. Alternatively, the zero-biased etching process may use other halogen-based etching chemistries. In an example, the dry etching process includes an etching pressure of about 1 mT to about 100 mT, a source power of about 100 W to about 2,000 W, an RF bias voltage of about 0 V, a $Cl_2$ gas flow of about 1 sccm to about 500 sccm, and an He gas flow of about 1 sccm to about 1,000 sccm. After the etching process 250, a pre-cleaning process may be performed to clean the trenches 252 with a hydrofluoric acid (HF) solution or other suitable solution.

In FIG. 5, the trenches 252 have a profile substantially similar to a profile of the doped regions 232. For example, the trenches 252 are aligned with the gate structures 220 and 221. The etching process 250 may thus be referred to as a self-aligned etching process, meaning a profile of the trenches 252 is self aligned with the gate structures 230 and 231. In the depicted embodiment, this occurs (1) because the zero-biased plasma etching process that uses the chlorine-based etching chemistry can isotropically etch heavily doped silicon (here, heavily doped n-type silicon doped regions 232) and (2) the zero-biased plasma etching process that uses the chlorine-based etching chemistry is sensitive to the steric barrier between the doped regions 232 and the substrate 210, such that the etching process 250 is limited to the doped regions 232 when removing the portions of the substrate 210. With respect to isotropically etching the substrate 210, the profile of the trenches 252 (self-alignment with the gate structures 230 and 231) despite a thickness of the spacers 240. Accordingly, a desired profile of the trenches 252 is achieved, even if thickness of each spacer 240 varies. With respect to the steric barrier, in the depicted embodiment, the etching process 250 relies on a steric hinderance phenomenon, which impedes low energy Cl atoms from reaching subsurface Si—Si bonds of the substrate 210 (undoped or lightly doped portions of the substrate 210), while a higher Fermi level of the doped regions 232 promotes charge transfer, allowing a more ionic bond between surface Si and adsorbed Cl, which in turn allows subsequent low energy Cl to access additional sites of the Si, and thus etch the silicon portions of the doped regions 232, while not etching the silicon portions of the substrate 210. The substrate 210 (particularly the undoped and lightly doped portions of the substrate 210) thus act as an etch stop layer. Other combinations of doped regions 232 and etching chemistries may be used to achieve the profile similar to that illustrated in FIG. 5.

Figure 6:
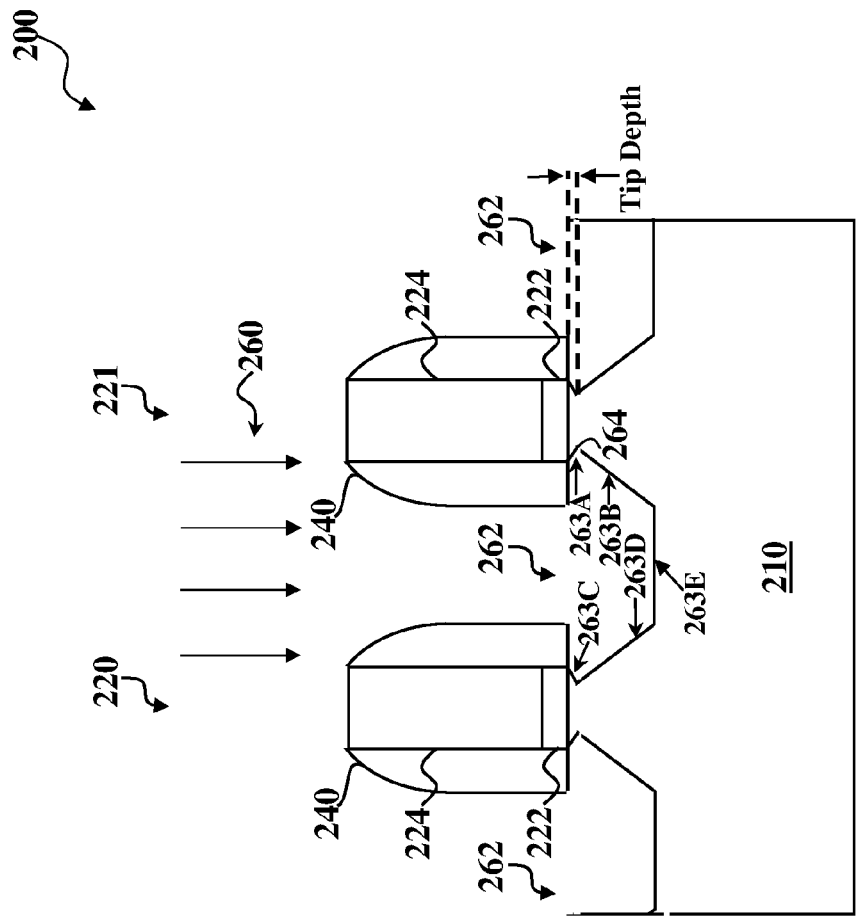

In FIG. 6, an etching process 260 further removes portions of the substrate 210 to modify a profile of the trenches 252, forming trenches 262 in the substrate 210. The etching process includes a dry etching process, wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters. In the depicted embodiment, the etching process 260 uses a wet etching process. The wet etching solution may include $NH_4OH$, KOH (potassium hydroxide), HF (hydrofluoric acid), TMAH (tetramethylammonium hydroxide), other suitable wet etching solutions, or combinations thereof. In an example, the wet etching process implements a TMAH solution at room temperature. Alternatively, the etching process 260 uses a dry etching process. For example, the dry etching process is a biased plasma etching process that uses a chlorine-based chemistry. The biased plasma etching process that uses a chlorine-based chemistry may anistropically etch the substrate 210. In an example, the dry etching process includes an etching pressure of about 1 mT to about 100 mT, a source power of about 100 W to about 2,000 W, an RF bias voltage of about 50 V to about 500 V, a $Cl_2$ gas flow of about 10 sccm to about 1,000 sccm, and an inert gas (such as Ar or He) flow of about 10 sccm to about 1,000 sccm. After the etching process 260, a pre-cleaning process may be performed to clean the trenches 260 with a hydrofluoric acid (HF) solution or other suitable solution.

In the depicted embodiment, the etching profile of the trenches is defined by facets 263A, 263B, 263C, 263D, and 263E of the substrate 210. The facets 263A, 263B, 263C, and 263D may be referred to as shallow facets, and the facet 263E may be referred to as a bottom facet. In the depicted embodiment, the etching profile of the trenches 262 is defined by facets 263A, 263B, 263C, and 263D in a {111} crystallographic plane of the substrate 210, and facet 263E in a {100} crystallographic plane of the substrate 210. While a theoretical angle between two {111} planes is about 109.5°, the angle between the shallow facets 263A and 263B, and 263C and 263D, may differ from this theoretical value depending on the etching conditions and local substrate doping level. In an example, an angle between the shallow facets 263A and 263B is about 90.0° to about 180.0°; an angle between the facets 263B and 263E is about 120.0° to about 170.0°; an angle between the shallow facets 263C and 263D is about 90.0° to about 180.0°; and an angle between the facets 263D and 263E of the substrate 210 is from about 120.0° to about 170.0°. The trenches 262 further define a tip depth (or height) of a tip 264. The tip depth defines a distance between a top surface of the substrate 210 and an intersection of the facets 263A and 263B (or an intersection of the facets 263C and 263D). In the depicted embodiment, the etching profile of the trenches 262 achieves a tip depth that is about 0.5 the depth, X, of the doped regions 232 (in other words, tip depth=about 0.5X). Accordingly, the depth of the doped regions 232 may be varied to achieve a desired tip depth depending on design requirements of the integrated circuit device 200.

Figure 7:
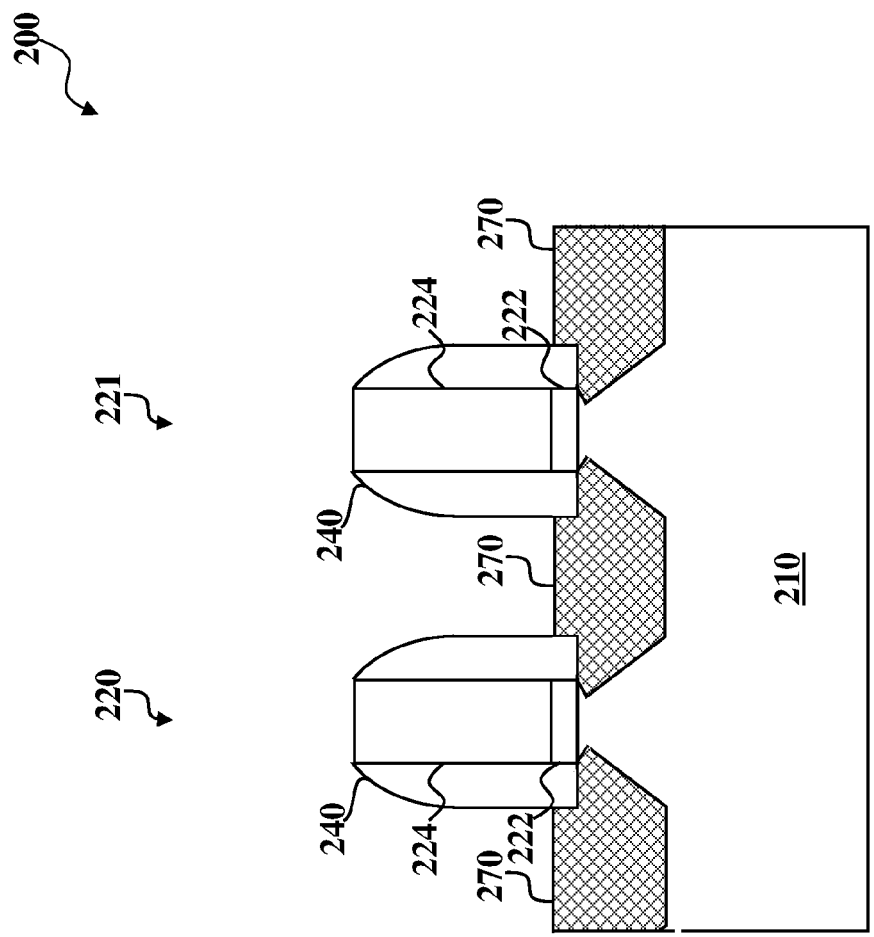

In FIG. 7, a semiconductor material is formed in the recesses 262 to form a strained structure. The semiconductor material forms source and drain features 270 in the recesses 262. The source and drain features 270 may alternatively be referred to as raised source and drain features. In the depicted embodiment, an epitaxy or epitaxial (epi) process is performed to deposit the semiconductor material in the recesses 262. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi process, or combination thereof. The epi process may use gaseous and/or liquid precursors, which may interact with the composition of the substrate 210. In an example, where an NFET device is desired, the source and drain features 270 include epitaxially grown silicon (epi Si). Alternatively, where a PFET device is desired, the source and drain features 270 include epitaxially grown silicon germanium (SiGe). The source and drain features 270 may be in-situ doped or undoped during the epi process. For example, the epitaxially grown SiGe source and drain features may be doped with boron; and the epitaxially grown Si epi source and drain features may be doped with carbon to form Si:C source and drain features, phosphorous to form Si:P source and drain features, or both carbon and phosphorous to form SiCP source and drain features. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 270 may further be subjected to annealing processes, such as a rapid thermal annealing process.

The etching profile of the trenches 262, and thus a profile of the source and drain features 270, enhances performance of the integrated circuit device 200. For example, a location of the trenches 262 (and thus the source and drain features) relative to the gate structures 220 and 221 directly impacts any stress and strain introduced by the source and drain features 270. In the depicted embodiment, the self-aligned implantation and etching processes described above ensure that the trenches 262 (and ultimately the source and drain features 270) are self-alined with the gate structures 220 and 221, which enhances any strain or stress induced by the source and drain features 270 on a channel of the integrated circuit device 200 (which, in the depicted embodiment, are disposed respectively below the gate structures 220 and 221, and defined between the source and drain features 270). The enhanced strain or stress provides enhanced device performance. In addition to strain or stress enhancement, self-aligned source and drain features also provide improved control of short channel effects (SCE) because the dopant distributions can be controlled through the self-aligned source and drain features. Precise control of relative positions between source, gate, and drain structures provides a key to controlling short channel effects. Further, the disclosed self-aligned implantation and etching processes provides proximity control within 1 atomic layer, providing greater control of achieving a desired tip proximity as well as tip height. Different embodiments may have different advantages, and no particular advantage is necessarily required of any embodiment.

Other processing may be implemented to form other features of the integrated circuit, as discussed briefly below. For example, lightly doped source and drain (LDD) features and/or heavily doped source and drain (HDD) features may be formed by ion implantation of n-type dopants, such as phosphorous or arsenic, or p-type dopants, such as boron. The LDD and/or HDD regions may be formed at any time in the depicted embodiment. Additionally, silicide features are formed on the source and drain features 270, for example, to reduce contact resistance. The silicide features may be formed on the source and drain features by a self-aligned salicide process, which can include depositing a metal layer, annealing the metal layer such that the metal layer is able to react with silicon to form silicide, and then removing the non-reacted metal layer.

In an example, an inter-level dielectric (ILD) layer is formed on the substrate and a chemical mechanical polishing (CMP) process is further applied to the substrate to planarize the substrate. Further, a contact etch stop layer (CESL) may be formed on top of the gate structures 220 and 221 before forming the ILD layer. In an embodiment, the gate layer 224 remains poly in the final device. In another embodiment, the poly is removed and replaced with a metal in a gate last or gate replacement process. In a gate last process, the CMP process on the ILD layer is continued to expose the poly of the gate structures, and an etching process is performed to remove the poly, thereby forming trenches. The trenches are filled with a proper work function metal (e.g., p-type work function metal and n-type work function metal) for the PFET devices and the NFET devices.

In an example, a multilayer interconnection (MLI) including metal layers and inter-metal dielectric (IMD) layers is formed over the substrate 210, such as over the ILD layer, to electrically connect various features or structures of the integrated circuit device 200. The multilayer interconnection includes vertical interconnects, such as vias or contacts, and horizontal interconnects, such as metal lines. The various interconnection features may implement various conductive materials including aluminum, copper, titanium, tungsten, alloys thereof, silicide materials, other suitable materials, or combinations thereof. In one example, a damascene process is used to form copper multilayer interconnection structure.

The integrated circuit device 200 serves only as example. The integrated circuit device 200 may be used in various applications such as digital circuitry, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other types of transistors, including single-gate transistors, double-gate transistors, and other multiple-gate transistors, and may be employed in many different applications, including sensor cells, memory cells, logic cells, and others.

The present disclosure provides for many different embodiments. In a method includes forming a gate structure over a substrate; forming a doped region in the substrate such that a steric barrier is achieved between the doped region and the substrate, wherein the doped region is interposed by the gate structure; performing a first etching process to form a trench in the substrate, wherein the steric barrier limits the first etching process to removing the doped region in the substrate; and performing a second etching process that modifies the trench by removing portions of the substrate. The method may further include forming a source/drain feature in the trench. In an example, forming the source/drain feature in the trench includes epitaxially growing a semiconductor material in the trench. The method may further include forming spacers adjacent sidewalls of the gate structure before performing the first etching process. In an example, forming the doped region in the substrate such that the steric barrier is achieved between the doped region and the substrate includes the doped region having a doping concentration that achieves the steric barrier. Performing the first etching process may include performing a zero-biased plasma etching process that selectively etches the doped region. The zero-biased plasma etching process may use a chlorine-based etching chemistry. The method may further include performing an annealing process to modify a doping concentration of the doped region. Performing the first etching process may include self-aligning the trench with the gate structure and/or isotropically etching the doped region.

In another example, a method includes forming a gate structure over a semiconductor substrate; performing an implantation process to form doped regions in the semiconductor substrate, wherein the doped regions are aligned with the gate structure; forming spacers adjacent sidewalls of the gate structure, wherein the spacers are partially disposed over the doped regions; performing a zero-biased plasma etching process that selectively etches the doped regions from the substrate to form trenches; and modifying a profile of the trenches. Performing the implantation process may include implanting an n-type dopant in the semiconductor substrate, and performing the zero-biased plasma etching process may include using a chlorine-based etching chemistry. Implanting the n-type dopant may include implanting the n-type dopant with a doping concentration that achieves a steric barrier between the doped regions and the substrate. The doping concentration may be greater than or equal to about $5\times10^{19}$ atoms/cm$^3$. The method may further include epitaxially growing a semiconductor material to fill the trenches having the modified profile. Modifying the profile of the trench may include performing a dry etching process that uses a biased plasma etching process that includes a chlorine-containing etching chemistry. Modifying the profile of the trench may include performing a wet etching process that uses a tetramethylammonium hydroxide (TMAH) etching solution at room temperature.

In yet another example, a method includes forming a gate stack over a semiconductor substrate, wherein the gate stack interposes a source region and a drain region; forming n-type doped regions respectively in the source region and the drain region, wherein the n-type doped regions are aligned with the gate stack; performing a zero-biased plasma etching process that uses a chlorine-containing etching chemistry to selectively remove the n-type doped regions to form trenches in the source region and the drain region; and performing an etching process to modify a profile of the trenches. Performing the etching process may include using a tetramethylammonium hydroxide (TMAH) etching solution at room temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate structure over a substrate, wherein the gate structure includes a gate electrode having a first sidewall surface and a gate dielectric having a second sidewall surface;
   forming a doped region in the substrate adjacent a channel region of the gate structure;
   performing a first etching process to remove the doped region and form a trench in the substrate, wherein the trench has a third sidewall surface that extends from the gate dielectric and is substantially coplanar with the first sidewall surface of the gate electrode and the second sidewall surface of the gate dielectric, wherein after performing the first etching process the trench is positioned closer to the channel region of the gate structure than any remaining portion of the doped region; and
   performing a second etching process that modifies the trench by removing portions of the substrate.

2. The method of claim 1 further including forming a source/drain feature in the modified trench.

3. The method of claim 2 wherein the forming the source/drain feature in the modified trench includes epitaxially growing a semiconductor material in the modified trench.

4. The method of claim 1 further including forming spacers adjacent sidewalls of the gate structure before performing the first etching process.

5. The method of claim 1 wherein the forming the doped region in the substrate includes forming the doped region with a doping concentration that achieves a steric barrier between the doped region and the substrate.

6. The method of claim 5 wherein the performing the first etching process to remove the doped region in the substrate includes performing a zero-biased plasma etching process that selectively etches the doped region.

7. The method of claim 6 wherein the performing the zero-biased plasma etching process that selectively etches the doped region includes using a chlorine-based etching chemistry.

8. The method of claim 1 further including performing an annealing process to modify a doping concentration of the doped region.

9. The method of claim 1 wherein the performing the first etching process includes isotropically etching the doped region.

10. A method comprising:
    forming a gate structure over a semiconductor substrate;
    performing an implantation process to form a doped region in the semiconductor substrate, wherein the doped region is aligned with the gate structure, wherein the doped region has a cross-sectional profile shape;
    forming a spacer adjacent a sidewall of the gate structure, wherein the spacer is disposed over the doped region and has a bottommost surface facing the semiconductor substrate;
    performing a zero-biased plasma etching process that selectively etches the doped region from the substrate to form a trench, wherein the doped region is completely removed by performing the zero-biased plasma etching process, wherein the trench has the cross-sectional profile shape;
    modifying a profile of the trenches; and
    forming a source/drain feature in the trench having the modified profile, wherein the source/drain feature physically contacts the entire bottommost surface of the spacer.

11. The method of claim 10 wherein:
    the performing the implantation process to form the doped region in the semiconductor substrate includes implanting an n-type dopant in the semiconductor substrate; and
    the performing the zero-biased plasma etching process that selectively etches the doped region from the substrate to form the trench includes using a chlorine-based etching chemistry.

12. The method of claim 11 wherein the implanting the n-type dopant in the semiconductor substrate includes implanting the n-type dopant with a doping concentration that achieves a steric barrier between the doped region and the substrate.

13. The method of claim 12 wherein the doping concentration is greater than or equal to about $5\times10^{19}$ atoms/cm$^3$.

14. The method of claim 10 wherein the performing the implantation process to form the doped region in the semiconductor substrate includes implanting one of a doping and non-doping species at an angle normal to a surface of the semiconductor substrate.

15. The method of claim 10 wherein the performing the implantation process to form the doped region in the semiconductor substrate includes implanting one of a doping and non-doping species at an angle tilted from a normal to a surface of the semiconductor substrate.

16. The method of claim 10 wherein forming the source/drain feature in the trench having the modified profile includes epitaxially growing a semiconductor material to fill the trench having the modified profile, wherein the semiconductor material physically contacts the entire bottommost surface of the spacer.

17. The method of claim 10 wherein the modifying the profile of the trench includes performing a dry etching process, a wet etching process, or a combination thereof.

18. The method of claim 17 wherein the performing the wet etching process includes using a tetramethylammonium hydroxide (TMAH) etching solution at room temperature.

19. The method of claim 17 wherein the performing the dry etching process includes using a biased plasma etching process that includes a chlorine-containing etching chemistry.

20. A method comprising:
   forming a gate stack over a semiconductor substrate, wherein the gate stack interposes a first source/drain region and a second source/drain region, wherein the gate stack includes a gate electrode having a first sidewall surface and a gate dielectric having a second sidewall surface;
   forming an n-type doped region in the first source/drain region, wherein the n-type doped region is adjacent a channel region of the gate stack;
   performing a zero-biased plasma etching process that uses a chlorine-containing etching chemistry to selectively remove the n-type doped regions to form a trench in the first source/drain region, wherein after performing the zero-biased plasma etching process the trench is positioned closer to the channel region of the gate stack than any remaining portion of the doped region; and
   performing a biased etching process to modify a profile of the trench.

21. The method of claim 20, wherein the n-type dope regions are completely removed after performing the zero-biased plasma etching process.

22. The method of claim 10, wherein the gate structure includes a gate electrode having a first sidewall surface and a gate dielectric having a second sidewall surface, and
   wherein the trench has a third sidewall surface that extends from the gate dielectric and is substantially coplanar with the first sidewall surface of the gate electrode and the second sidewall surface of the gate dielectric.

* * * * *